United States Patent [19]

Van Hooreweder

[11] 4,393,579
[45] Jul. 19, 1983

[54] DEVICE FOR MOUNTING CHIP-TYPE ELECTRONIC COMPONENTS ON A SUBSTRATE

[75] Inventor: Godwin J. O. G. Van Hooreweder, Brugge, Belgium

[73] Assignee: U. S. Philips Corporation, New York, N.Y.

[21] Appl. No.: 235,802

[22] Filed: Feb. 19, 1981

[30] Foreign Application Priority Data

Feb. 25, 1980 [NL] Netherlands ........................ 8001114

[51] Int. Cl.³ ........................................... B23P 19/00
[52] U.S. Cl. ...................................... 29/740; 29/743; 29/759; 29/809; 29/834; 156/556; 156/566; 206/329; 228/6 A; 414/131
[58] Field of Search ................. 29/740, 743, 759, 834, 29/840, 809, 741; 156/299, 303, 556, 566; 414/131, 589, 222, 223, 225; 228/6 A, 47; 206/329, 334, 328

[56] References Cited

U.S. PATENT DOCUMENTS

| | | | |
|---|---|---|---|
| 2,840,892 | 7/1958 | Erdmann | 29/809 |
| 3,475,805 | 11/1969 | Rottmann | 29/740 |
| 3,963,456 | 6/1976 | Tsuchiya et al. | 29/739 |
| 4,298,120 | 11/1981 | Kaneko et al. | 206/329 |
| 4,307,832 | 12/1981 | Taki et al. | 228/6 A |
| 4,327,482 | 5/1982 | Araki et al. | 29/740 |
| 4,327,483 | 5/1982 | Zemek et al. | 29/741 |
| 4,346,514 | 8/1982 | Makizawa et al. | 29/740 |

Primary Examiner—Carl E. Hall
Assistant Examiner—P. W. Echols
Attorney, Agent, or Firm—David R. Treacy

[57] ABSTRACT

A device for mounting leadless chip-type electronic components on a substrate. A mounting head includes a slide which is displaceable in a guide in a single direction between a loading position and an unloading position, and a suction device which is displaceable in a vertical direction only at the area of the unloading position. A component to be mounted, dispensed from a magazine or from a carrier strip, is transported by the slide from the loading position to the unloading position where the component is picked up and then moved down onto the substrate by the suction device. As a result of the controlled displacement of the components in only two directions, accurate and reproduceable positioning of the component is achieved.

4 Claims, 8 Drawing Figures

DEVICE FOR MOUNTING CHIP-TYPE ELECTRONIC COMPONENTS ON A SUBSTRATE

BACKGROUND OF THE INVENTION

The invention relates to a device for mounting chip-type electronic components on a substrate, comprising a table, a mounting head and means for positioning a substrate.

The increasing emphasis on miniaturization in the electronics industry has resulted in the development of plate-shaped, block-shaped and cylinder-shaped chip-type components devoid of connection wires, that is to say components without the conventional, comparatively long radial or axial connection wires.

These components without connection wires comprise contact portions which are provided on opposite faces or sides, such as capacitors, resistors, coils, or short connection studs, such as diodes and transistors. The components are arranged on a substrate having printed wiring, glue or tracks of solder paste on the component side thereof. The components have dimensions in the order of from 0.5 mm to several millimeters. In view of the small dimensions of the components and considering the possible dense pattern of tracks, the components must be accurately positioned with respect to the tracks on the substrate.

U.K. Patent Specification No. 1,477,027 discloses a device of the described kind in which the components are fed via tubes and apertures and are positioned on a slidable plate, situated over the substrate, in a position which corresponds to the desired position of the components on the substrate; subsequently, the plate is displaced while the components are retained, so that the components ultimately drop onto the substrate. Due to the uncontrolled dropping motion, there is a risk that the components start to tilt, rotate and/or land in an undesirable position on the substrate.

SUMMARY OF THE INVENTION

The object of the invention is to provide a device which enables accurate positioning and mounting of chip-type components on a substrate in a controlled and reproducible manner, with a minimum of movements and changes of direction.

In accordance with the invention slide having a recess for accommodating and transporting a component is linearly displaceable in a guide between a loading position and an unloading position, and a suction device which is displaceable in the vertical direction serves to pick up a component from the slide when the latter is in the unloading position, and then move the component downward through a passage in the guide to position the picked up component onto the substrate positioned underneath the guide.

The slide transports the component linearly and at a comparatively high speed, and in the unloading position of the slide the component is situated in the desired X-Y position over the positioned substrate, just underneath the tip of the suction pipe. Subsequently, the component is picked up and retained by the suction pipe. After that, the slide is returned to the loading position, and the pipe with the retained component is displaced through the shaft in the direction of the substrate, the component ultimately being placed on the substrate. After removal of the vacuum, the pipe is returned to the starting position. Thanks to the controlled displacement of the component in only two directions, the component is accurately positioned on the substrate.

The components are fed by hand or, for example, by mechanical pick up means or by a suction pipe from a vibrating feeder or from a package, like a tape, a cartridge or a magazine and are transported one by one by the slide to the unloading position. However, the device offers special advantages in combination with a carrier strip which comprises cavities in which the components are located. To this end, a preferred embodiment of the device in accordance with the invention is characterized in that the mounting head comprises a punch at the area of the loading position of the slide, the device furthermore comprising means for transporting and guiding a strip-shaped or tape-shaped carrier with components between the punch and the guide.

Thanks to the simple transfer of a component from the carrier to the slide by means of the punch which performs only a vertical movement, a comparatively high mounting frequency is obtained; this is important for the successive mounting of a large number of components on one and the same substrate.

In view of their shape, chip-type electronic components are particularly suitable for stacking in elongated magazines. Components which are supplied in stacked form in magazines can also be simply and efficiently mounted by means of a further preferred embodiment of the device in accordance with the invention, which is characterized in that the mounting head comprises a holder for a magazine with stacked components at the area of the loading position of the slide, the device furthermore comprising means for transferring one component a time to the recess in the slide.

In another embodiment of the device in accordance with the invention, the suction pipe is rotatable about its center line, so that the component to be mounted can be positioned on the substrate not only in the X-Y direction but also in the desired angular position, viewed in the circumferential direction.

The invention will be described in detail hereinafter with reference to the accompanying diagrammatic drawing.

BRIEF DESCRIPTION OF THE DRAWING

Corresponding elements are denoted by the same reference numerals in the Figures.

DESCRIPTION OF THE PREFERRED EMBODIMENTS

Figure 1:
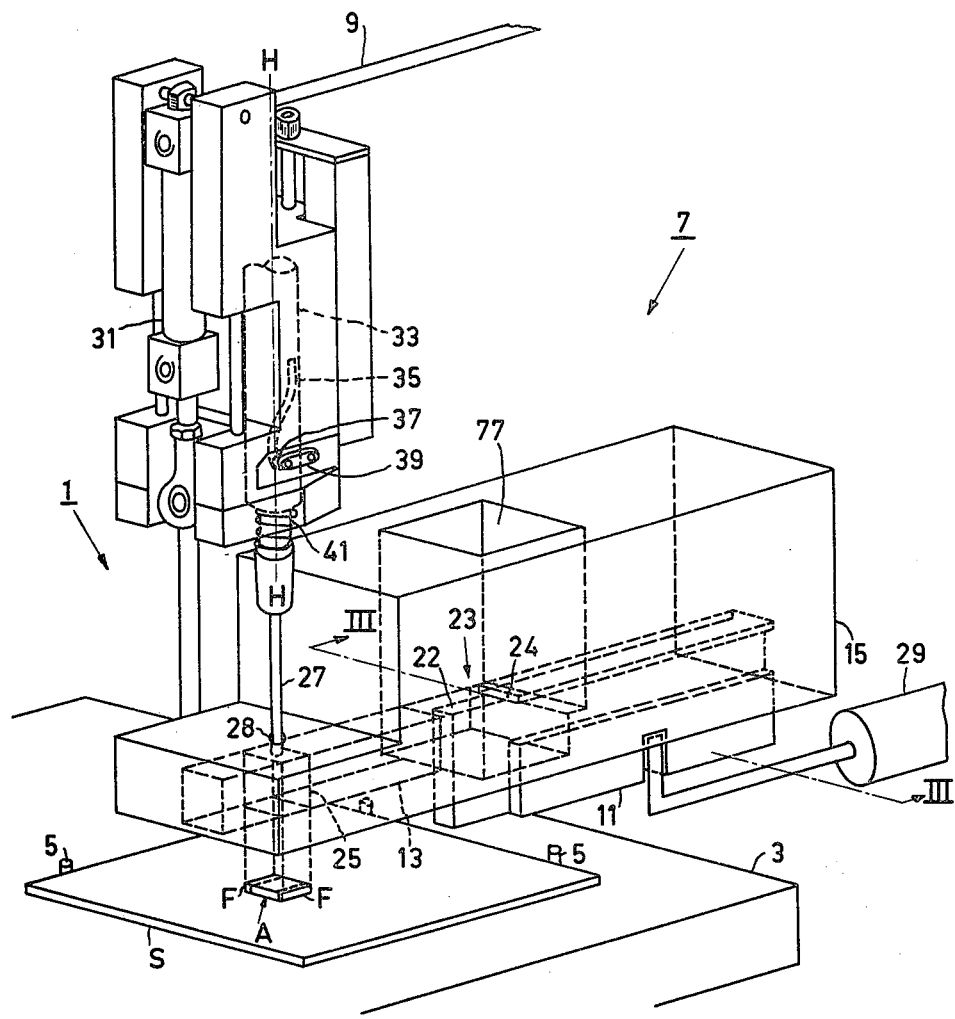
FIG. 1 is a perspective view of an embodiment of the device in accordance with the invention.
Figure 2:
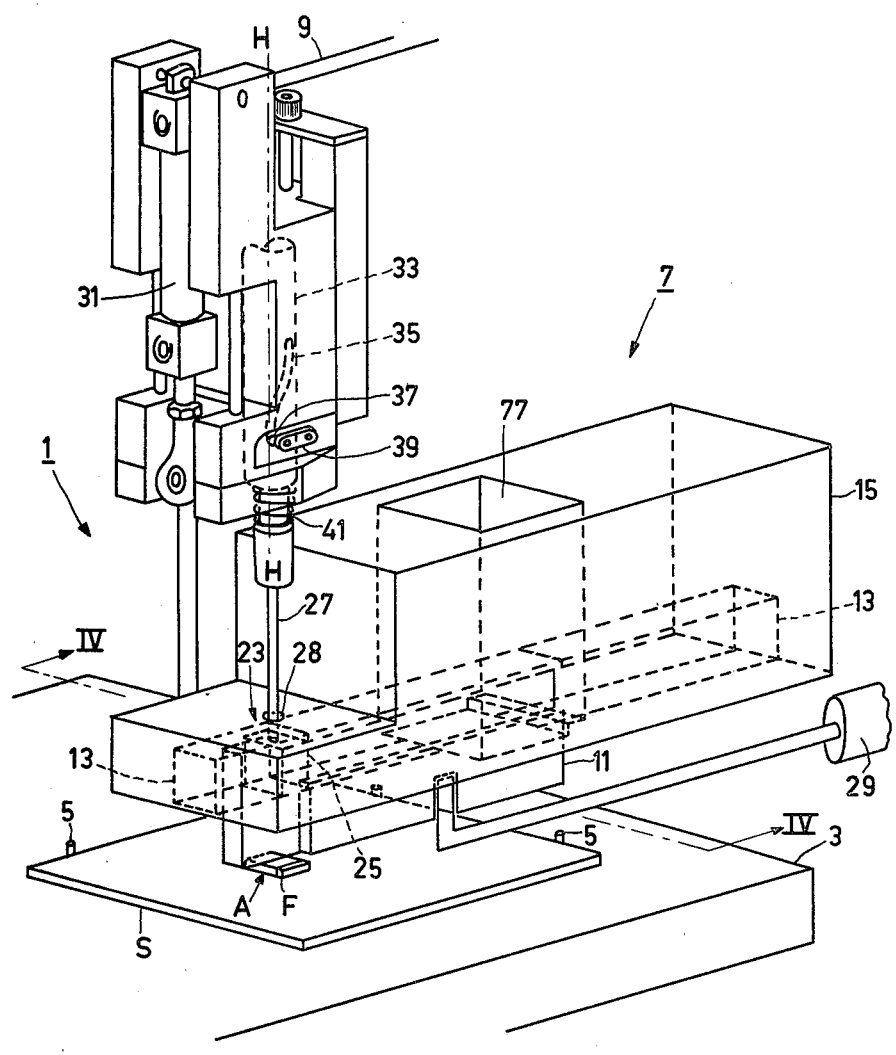
FIG. 2 shows the device of FIG. 1 in a different position.
Figure 3:
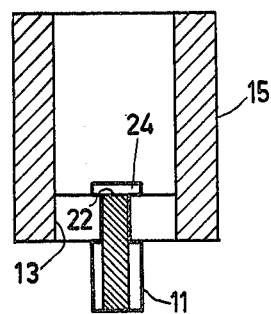
FIG. 3 is a cross-sectional view of the device, taken along the line III—III in FIG. 1.
Figure 3:
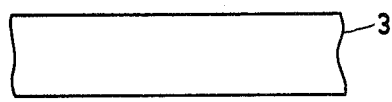
Figure 4:
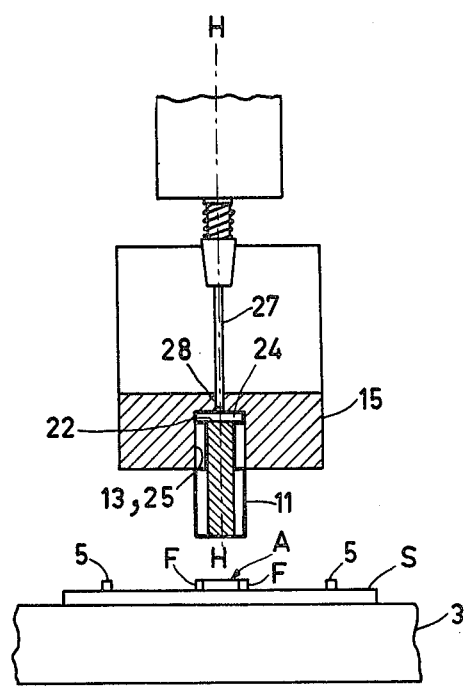
FIG. 4 is a cross-sectional view of the device, taken along the line IV—IV in FIG. 2.

The FIGS. 1 to 4 show a device 1 for mounting a plate-shaped or block-shaped chip-type component A comprising contact faces F and devoid of connection wires on a substrate S which is provided with printing wiring. The device 1 includes a table 3, pins 5 for positioning the substrate S on the table 3, and a mounting head 7. By way of a side wall 9, the mounting head 7 is secured on the table 3 so as to be adjustable in the X-Y direction. The mounting head 7 comprises mainly a slide 11 which is slidable in a channel 13 of a horizontal beam 15, said channel serving as a guide for the slide 11. The profile of the channel 13 is shown in the FIGS. 3 and 4. The slide 11 is displaceable between two extreme positions, that is to say a loading position as shown in FIG. 1 and an unloading position as shown in FIG. 2. The slide 11 comprises a recess 23 which forms a set for a component A to be accommodated and transported and which comprises a horizontal support surface 22 and a vertical abutment face 24. At the area of the unloading position of the slide 11, the beam 15 has a vertical passage 25 which communicates with the channel 13. The transverse dimensions of the passage 25 are slightly larger than and dependent on those of the component A. At the area of the shaft 25, the mounting head 7 comprises a suction pipe 27 which is displaceable in the vertical direction. The slide 11 and the suction pipe 27 are displaced by means of pneumatic cylinders 29 and 31, respectively. The extreme positions of the slide 11 and the suction pipe 27 are determined by the extreme positions of the pistons in the cylinders 29 and 31.

The operation of the device shown in the FIGS. 1 to 4 is as follows: A substrate S is positioned on the table 3 by means of the pins 5. The slide 11 is in the loading positon shown in the FIG. 1. A component A is suitably arranged in the recess 23 of the slide 11. Subsequently, the slide 11 is slid to the unloading position, shown in FIG. 2, in which the slide 11 closes the passage 25. The suction pipe 27 is then in the initial position shown in FIG. 1, its tip being situated in an aperture 28 in the beam 15 in the vicinity of the component A which is picked up and slightly lifted. The slide 11 is subsequently returned to the loading position; as soon as the slide 11 has been withdrawn from the passage 25, the pipe 27 is displaced, together with the component A, though the passage 25 in the direction of the substrate S, until the component A contacts a layer of glue or tracks of solder paste, previously depositioned on the substrate, on which the component is slightly pressed by the suction pipe. Subsequently, the vacuum is removed and the suction pipe is returned upwards to its starting position.

As is shown in the FIGS. 1 and 2, the suction pipe 27 is connected to a rod 33. This rod comprises a groove 35 which extends through an angle of 90° and which can cooperate with a pin 37 provided on a lever 39. Using the lever 39, the pin 37 can be made to engage or disengage the groove 35. When the pin 37 engages the groove 35, the suction pipe 27 also peforms a rotary movement around its centre line H through an angle of 90° during its vertical displacement, so that, if desired, the component A can be rotated through an angle of 90° during its displacement by means of the suction pipe. When the pin 37 does not engage the groove 35, the pipe is not rotated.

Figure 5:
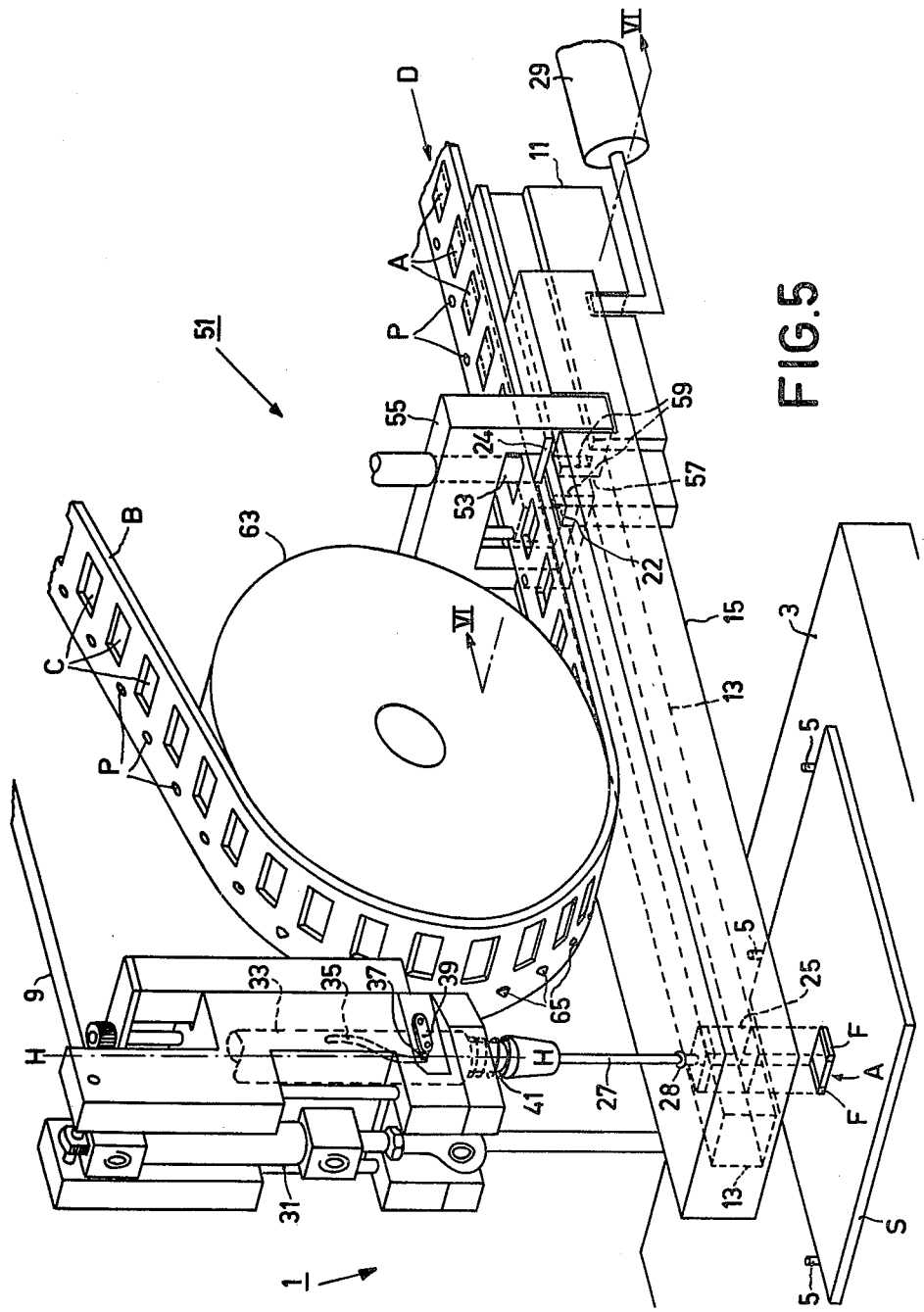
FIG. 5 shows a further embodiment of the device.
Figure 6:
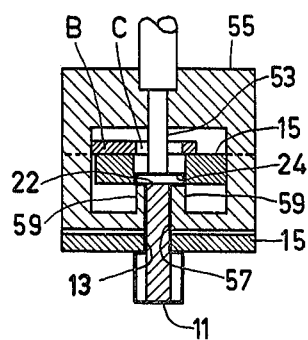
FIG. 6 is a cross-sectional view of the device of FIG. 5, taken along the line VI—VI.

The mounting head 51 of the device shown in the FIGS. 5 and 6 not only comprises the elements shown in the FIGS. 1 through 4, but also a punch 53 which is displaceable in the vertical direction and which is arranged above the beam 15 at the area of the recess 23 in the slide 11 when the latter is in the loading position. The punch 53 is connected to a transport block 55 which comprises a slot 57 for guiding the slide 11 and also guide ribs 59 for guiding and supporting a component A to be transported. The components A are accommodated in cavities C in a tape-shaped carrier B. The carrier B is step-wise moved in the direction of the arrow D by means of a transport roller 63 which comprises transport pins 65 cooperating with transport holes P. The transport of the carrier B is synchronized so that, when the carrier B is stationary, a component A in the carrier B is situated in front of the punch 53. The punch 53 is then displaced downwards, so that the component A is transferred from the cavity C to the recess 23 in the slide 11. Subsequently, the slide 11, accommodating the component A taken over from the carrier B, is slid to the unloading position; the further mounting of the component A is as previously described. After the raising of the punch 53, the carrier B is transported one step further, after which a next cycle can take place.

Figure 7:
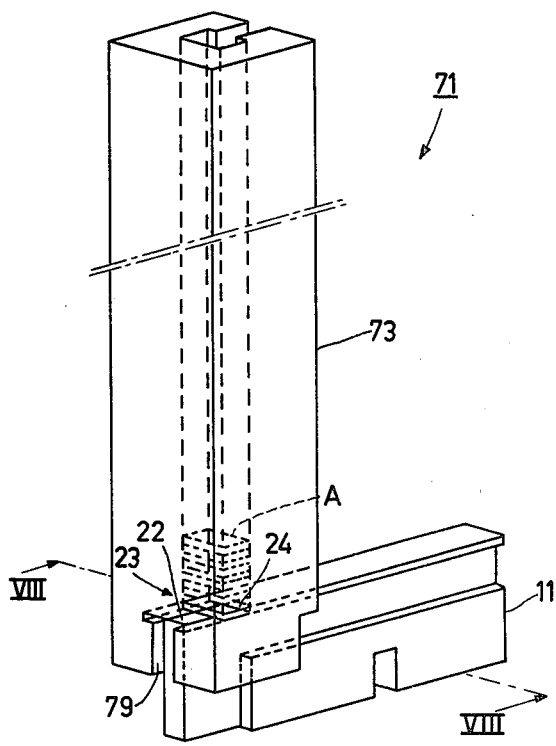
FIG. 7 shows a further embodiment of the device.
Figure 8:
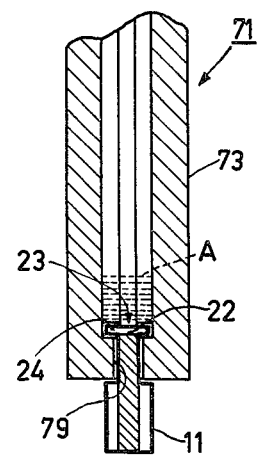
FIG. 8 is a cross-sectional view, taken along the line VIII—VIII, of the device shown in FIG. 7.

FIGS. 7 and 8 show a further embodiment of the device, the component A being dispensed from a magazine 73 in which they are stacked. To this end, the mounting head 71 of this device comprises a chamber 77 which is provided in the beam 15 and which serves as a holder for the magazine 73. The magazine is arranged in the chamber 77 so that the stacked components are situated over the recess 23 in the slide 11 when the latter is in the loading position. The supporting surface 22 of the slide is then situated in a recess 79 of the magazine 73, so that the lowermost component in the magazine bears on the supporting surface 23. This situation is shown in the FIGS. 7 and 8.

For the removal of a component A from the magazine 73, the slide 11 is displaced from the loading position shown in FIG. 7 to the unloading position, so that the lowermost component A is taken along to the unloading position by the vertical abutment face 24 of the slide 11. The further mounting of the component A is realized in the described manner. The slide 11 has a length such that the next component A of the stack is locked against displacement by the slide during the reciprocating movements of the slide, because this component is supported by the upper side of the slide.

The reference numeral 41 denotes a spring which enables a relative displacement of the suction pipe 27 with respect to the piston in the cylinder 31 when the force with which a component A is pressed against the substrate S by the pipe 27 becomes too high; damaging and/or fracturing of the components is thus prevented.

It will be clear from the description of the embodiments that the device in accordance with the invention is intended for the successive mounting of identical components on successive substrates. After arrangement of a component A on the substrate S in the described manner by means of the described device, this substrate is positioned with respect to a next mounting head, and a next substrate is positioned in the device shown.

What is claimed is:

1. A device for mounting chip-type electronic components on a substrate, comprising a table, a mounting head fixed to the table, and means for positioning a substrate with respect to the mounting head, characterized in that the mounting head comprises:
   a guide fixed in position with respect to the table, defining a single horizontal channel said guide having a vertical passage therethrough,
   a slide displaceably mounted in said guide for movement along said channel only between a loading position and an unloading position, and having a recess for accommodating and transporting a component, said recess having a horizontal supporting surface and a vertical abutment face for engaging a component being transported in the recess, a suction device moveably mounted to be displaceable in a vertical direction only, through said passage, and means for displacing said suction device upward to pick up a component from the slide when the slide is in the unloading position; and then when the slide is moved from the unloading position, downward to move the component through said passage to position the picked up component onto a substrate positioned underneath the guide.

2. A device as claimed in claim 1, characterized in that the device further comprises means for transporting and guiding a component carrier strip immediately above said guide past said loading position, and the mounting head comprises a punch arranged for vertical movement at the area of the slide loading position, for moving a component from the carrier strip to the recess in the slide.

3. A device as claimed in claim 1, characterized in that the mounting head comprises a magazine holder arranged for holding a magazine containing stacked components at the area of the slide loading position, and the device further comprises means for transferring one component at a time to the recess in the slide.

4. A device as claimed in claim 1, 2 or 3, characterized in that said suction device includes a suction pipe having a vertical center line, and means for rotating said pipe about said center line as said suction device moves downward to position the picked up component onto the substrate.

* * * * *